(12) United States Patent
Lowis

(10) Patent No.: US 7,439,582 B2
(45) Date of Patent: Oct. 21, 2008

(54) SEMICONDUCTOR DEVICE WITH SENSE STRUCTURE

(75) Inventor: Royce Lowis, Stockport (GB)

(73) Assignee: NXP B.V., Eindhoven (NL)

( * ) Notice: Subject to any disclaimer, the term of this patent is extended or adjusted under 35 U.S.C. 154(b) by 412 days.

(21) Appl. No.: 10/528,941

(22) PCT Filed: Sep. 12, 2003

(86) PCT No.: PCT/IB03/04080

§ 371 (c)(1),
(2), (4) Date: Mar. 23, 2005

(87) PCT Pub. No.: WO2004/030106

PCT Pub. Date: Apr. 8, 2004

(65) Prior Publication Data

US 2006/0163652 A1 Jul. 27, 2006

(30) Foreign Application Priority Data

Sep. 28, 2002 (GB) ................. 0222553.0

(51) Int. Cl.
*H01L 29/72* (2006.01)
(52) U.S. Cl. .............. 257/341; 257/329; 257/355; 327/434
(58) Field of Classification Search ............ 257/329, 257/341, 355; 327/434
See application file for complete search history.

(56) References Cited

U.S. PATENT DOCUMENTS

| | | | | |
|---|---|---|---|---|
| 5,801,573 A | * | 9/1998 | Kelly et al. ............ | 327/434 |
| 6,433,386 B1 | * | 8/2002 | Yun et al. ............... | 257/341 |

* cited by examiner

*Primary Examiner*—Edward Wojciechowicz
(74) *Attorney, Agent, or Firm*—Peter Zowilski

(57) ABSTRACT

A power semiconductor device is described with a plurality of cells divided into power cells (14) and sense cells (16). A plurality of groups (30, 32) of sense cells (16) are provided. The device allows for compensation of effects caused at the edges of the groups of sense cells (16).

14 Claims, 5 Drawing Sheets

SEMICONDUCTOR DEVICE WITH SENSE STRUCTURE

The invention relates to a semiconductor device with sense structure, and in particular to a power semiconductor device having a sense terminal, as well as to a system including the power semiconductor device.

A known example of a prior art power semiconductor device is a Sense metal-oxide-semiconductor field effect transistor (MOSFET) structure, conventionally shortened to SenseMOS. The SenseMOS has the source, gate and drain of a conventional MOS together with a further sense terminal that provides a sense current which should be proportional to the load current. In an ideal SenseMOS structure the sense current should be proportional to the load current under all operating conditions.

The current output on the sense terminal can be used, for example, to make a current protected switch. The sense current may be compared to a predetermined current, and when the sense current becomes too large, the voltage applied to the gate of the SenseMOS structure is reduced to reduce the output current.

An example of a SenseMOS structure and its use in a current-protected switch is described in WO 96/12346 to Philips Electronics NV. The device has a number of MOSFET cells—a few of these cells are connected to the sense terminal to supply the sense current and the rest are connected to a main output terminal to supply the main output current used to drive a load.

It will be appreciated by the skilled person that it is important in such applications that the sense current should accurately track the main current over a wide range of conditions. It is also highly desirable that the ratio of the current in the main cells to that in the sense cells should be the ratio of the number of cells. This means that during operation the conditions in every cell should be as identical as possible, and in particular the conditions in the small number of sense cells should match those in the main cells. However, such accurate matching is not always possible, especially when using small cell sizes (less than about 5-6 μm, for example), without using expensive manufacturing technology.

The invention aims to address this difficulty and allow for more accurate tracking of the main current.

According to the invention there is provided a power semiconductor device, comprising: first and second main terminals, at least one of which is for coupling a load; a control terminal; and a semiconductor body having opposed first and second major surfaces and a plurality of cells arranged as a lattice across the first major surface of the semiconductor body, the cells being divided into main cells and sense cells, each of the cells having a gate or base connected to the control terminal; wherein each of the main cells is connected in parallel between the first and second main terminals to couple the first and second main terminals under the control of the control terminal; the power semiconductor device further comprises first and second sense terminals; the sense cells are divided into a plurality of groups of sense cells each arranged across the lattice in a pattern, each group of sense cells being connected in parallel between a respective sense terminal and the second main terminal; and a first group of sense cells is arranged across the lattice in a pattern having a different ratio of edge to inner cells to a second group of sense cells, inner sense cells being cells surrounded by other sense cells of the group and edge sense cells being arranged on the edge of the group of sense cells.

The inventors have realised that a problem in prior art devices is edge effects. In other words, the electrical conditions in the cells at the boundary between main and sense cells are often not identical to the electrical conditions in the bulk of the cells. This problem is particularly acute when there are dummy cells, not connected to either the main electrode or a sense electrode, between the main and the sense cells. These unconnected dummy cells affect the current in the edge cells, as will be explained in more detail below.

Such edge effects are generally very minor in the main cells, where the number of cells at the edge of the group of main cells is very small compared with the total number of cells. However, there are in general a much smaller number of sense cells and edge effects can become highly significant in the sense cells. This, in prior art devices, means that the sense cells do not accurately track the current in the main cells.

The semiconductor device according to the invention compensates for this edge effect by providing two distinct groups of sense cells and respective sense terminals, the groups of sense cells being arranged in the lattice of cells in patterns such that the two groups of sense cells have different ratios of edge cells to inner cells. The two output currents then provide sufficient information to act both as a measure of the current in the inner cells and also as a measure of the current in the edge cells.

Preferably, the number of edge cells in the first group of sense cells substantially matches that in the second group. This makes it particularly easy to correct for the effects of edge cells.

In a particularly convenient arrangement a first group of sense cells is arranged in a pattern having at least 40% preferably 50% or even 80% edge cells—this may be achieved, for example, by using a line of cells as the sense cells. The output of this first group of sense cells then provides a measure of the current in the edge cells. A second group of sense cells is arranged to have a greater number of inner cells, although it will inevitably have edge cells as well. The current output from this second group of sense cells may then be corrected for the effect of the edge cells using the current output from the first group. This corrected, or compensated, signal then represents a much more accurate measure of the current in the main cells.

The invention is particularly applicable to power MOSFETs in which the cells are MOS cells having gate source and drain. The source and drain of main cells are connected to the first and second main terminals and the source and drain of sense cells of a group are connected between the first main terminal and the respective sense terminal of that group.

In embodiments, the MOSFETs may be trench MOSFETs. The skilled person will realise that the invention is not restricted to trench MOSFETs and the skilled person will be familiar with a number of other useful cell structures, including for example vertical and lateral MOSFET structures and even arrays of insulated gate bipolar devices.

The cells may be of any convenient shape, for example hexagonal, square, or stripes.

The power semiconductor device may be packaged as a discrete power semiconductor device.

The invention also relates to a semiconductor arrangement including the semiconductor device and further comprising a drive circuit having an output connected to the control terminal for driving the control terminal and a compensation circuit.

The compensation circuit preferably has first and second sense inputs connected directly or indirectly to the first and second sense terminals respectively and an output connected to the drive circuit for controlling the drive circuit, wherein the compensation circuit outputs to the drive circuit a measure of the current in inner sense cells obtained from the currents on the first and second sense inputs.

The compensation circuit may include a reference sub-circuit with an input connected to the first sense terminal and an output supplying a reference voltage, wherein the current from the first sense terminal is applied across a resistor to increase the reference voltage linearly with the current from the first group of sense cells.

The compensation circuit may further include a sense sub-circuit with an input connected to the second sense terminal connected to the second group of sense cells and a compensation input connected to the output of the reference sub-circuit, and an output supplying a compensated sense current signal to the drive circuit input for controlling the drive circuit to limit the current output by the power semiconductor device. The current from the second group of sense cells may be applied across a like resistor to that in the reference sub-circuit and the voltage generated across the like resistor compared with the input from the reference sub-circuit to generate the output.

In this way, when the number of edge cells in the first and second groups of sense cells is the same, the effect of the edge cells is compensated.

In a particular embodiment, the cells are MOS cells of predetermined first conductivity type having gate, source and drain, the drains of the main and sense cells being connected in common to the first terminal, and the source of the main cells being connected to the second terminal connected in turn to a source voltage rail ($V_{ss}$).

The drive circuit may include a FET of the first conductivity type having its source connected to the source voltage rail, its drain connected to the control terminal of the power semiconductor device and to a gate drive circuit.

The reference sub-circuit may include a FET of the first conductivity type having its source connected to the source voltage rail through a resistance, its drain connected through a resistance to a logic supply, its gate connected to the drain and to the output of the reference sub-circuit, and wherein the input of the reference sub-circuit is connected to the source of the reference sub-circuit FET for supplying the current output on the first sense terminal to the reference sub-circuit.

The sense sub-circuit may include a FET of the first conductivity type having its source connected to the source voltage rail through a resistance, its drain connected through a resistance to a logic supply, its gate connected to the output of the reference sub-circuit, and wherein the input of the sense sub-circuit is connected to the source for supplying the current output on the second sense terminal to the sense sub-circuit, for comparing the current with a value set by the reference sub-circuit and outputting a signal to the drive circuit.

The resistances between the FETs of the reference and sense sub-circuits and the source voltage rail are preferably matched sense resistors.

The semiconductor arrangement may be provided as an integrated package including the compensation circuitry.

Note that the specific compensation circuit described is not the only possibility and the skilled person will be able to carry out the same functions in many other ways. For example, an operational amplifier may be used.

For a better understanding of the invention, embodiments will now be described, purely by way of example, with reference to the accompanying drawings, in which.

It should be noted that the drawings are not to scale. Further, note that like components are given like reference numerals in different figures.

Figure 1:
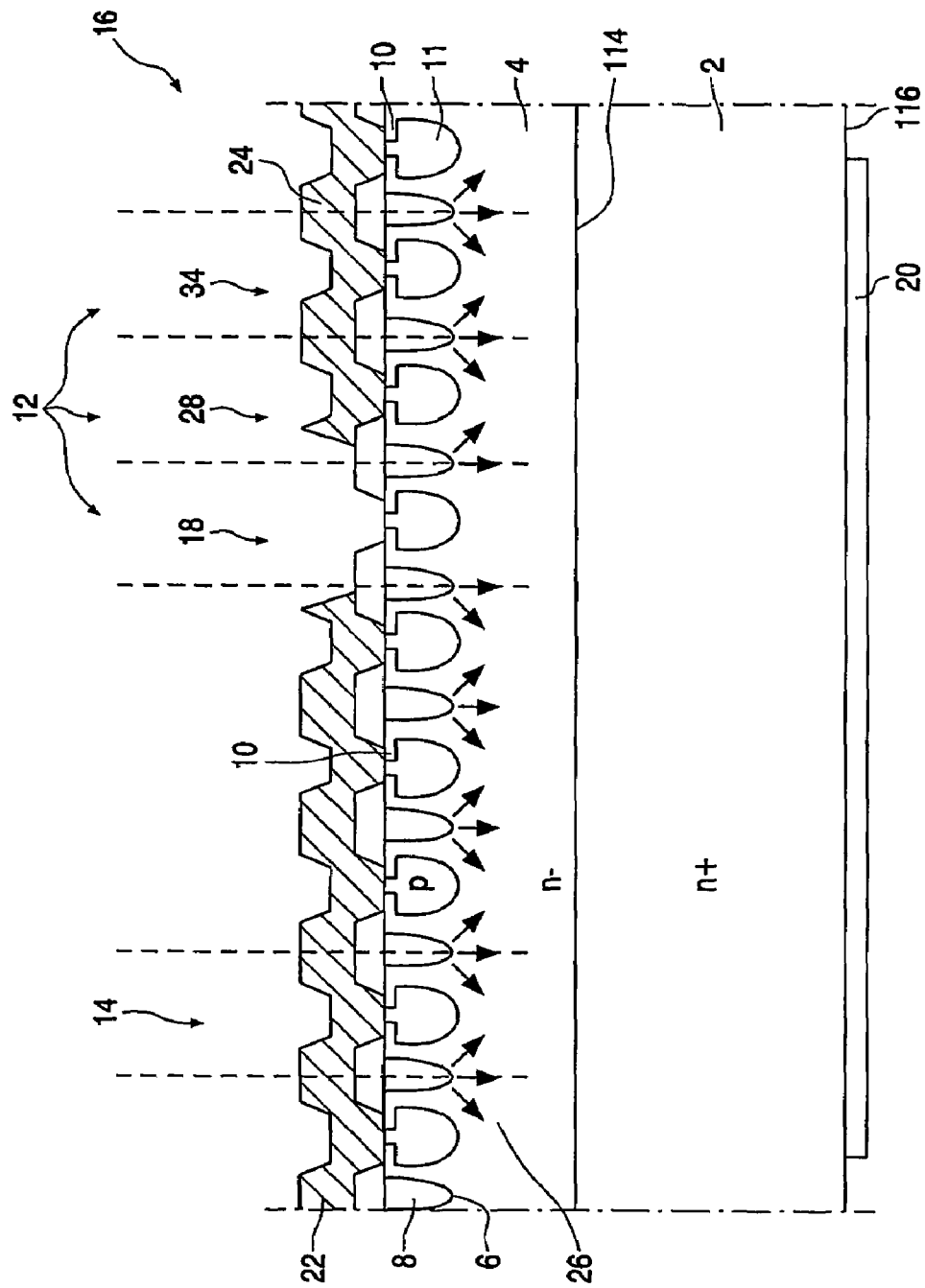
FIG. 1 shows a cross-sectional side view of a SenseMOS according to the invention.

Referring to FIG. 1, a cross-section through a trenchMOS structure is shown. An n+ substrate 2 has an n– epilayer 4 formed on its first major surface 114 and a drain contact 20 on its second major surface 116. The n+ substrate 2 constitutes the drain connected to drain contact 20.

A plurality of cells 12 are formed on the epilayer extending across the first major surface, the cells being defined by insulated trenches 6 filled with polysilicon gates 8. Source regions 10 and p-body regions 11 are formed between the trenches 6 in each cell 12.

Most of the cells are main cells 14, and the source regions 10 and the p-body regions 11 of these cells are connected in parallel to a main metallisation 22. FIG. 1 also shows a group of sense cells 16—the source regions 10 and p-body regions 11 of the sense cells are connected in parallel to sense metallisation 24.

When a small cell pitch is used then photolithographic tolerances do not allow sufficient space to contact reliably the source 10 and p-body region 11 of all the cells. Therefore, dummy cells 18 are used between sense cells 16 and the main cells 14—these cells are not connected and accordingly do not operate as normal cells. The cells adjacent to these dummy cells 18 will be referred to as edge cells 28.

The current paths 26 of the device of FIG. 1 are illustrated schematically. No source current flows in the dummy cell 18, and so less current flows along the gates 8 in the adjacent edge cells 28. This reduces current crowding effects in these cells and offer a lower resistance path. The net effect is that the edge cells 28 at the interface conduct a very different current from those in the middle of the array, which can have a very significant effect on the sense current. This effect is exacerbated if the ratio of main cells to sense cells is very high, as it can be.

Figure 2:
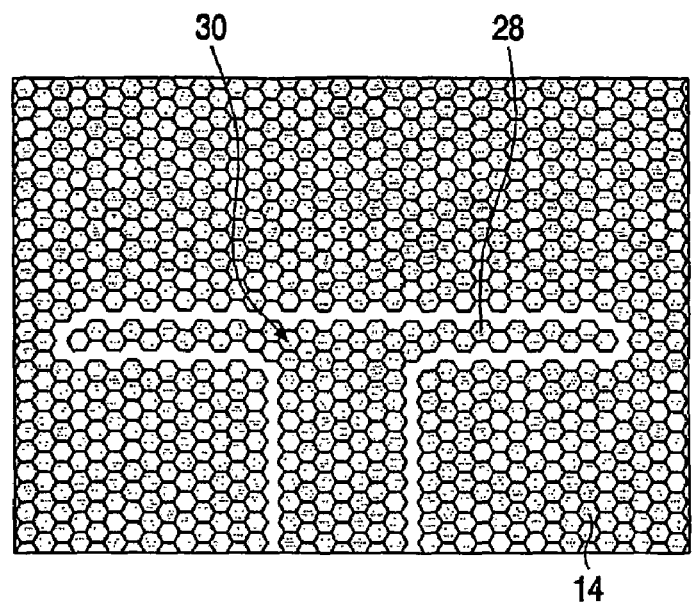
FIG. 2 shows a first arrangement of a group of sense cells in an arrangement according to the invention.
Figure 3:
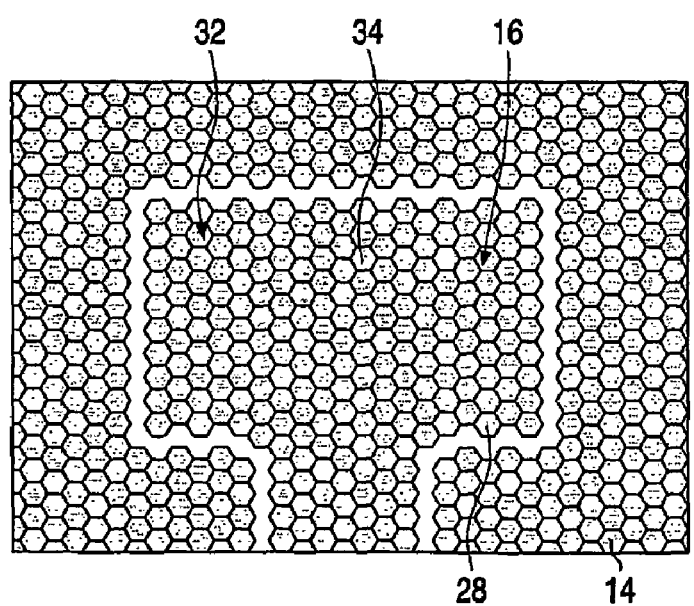
FIG. 3 shows a second arrangement of a group of sense cells in an arrangement according to the invention.

FIGS. 2 and 3 show top views of sense cell clusters used in this embodiment of the invention. FIG. 2 shows a first sense cell cluster 30 having above 50% edge cells 28 and FIG. 3 shows a second sense cell cluster 32 having both edge cells 28 and inner sense cells 34.

Note that the number of edge cells is the same in each of the two sense cell clusters 30, 32.

Figure 4:
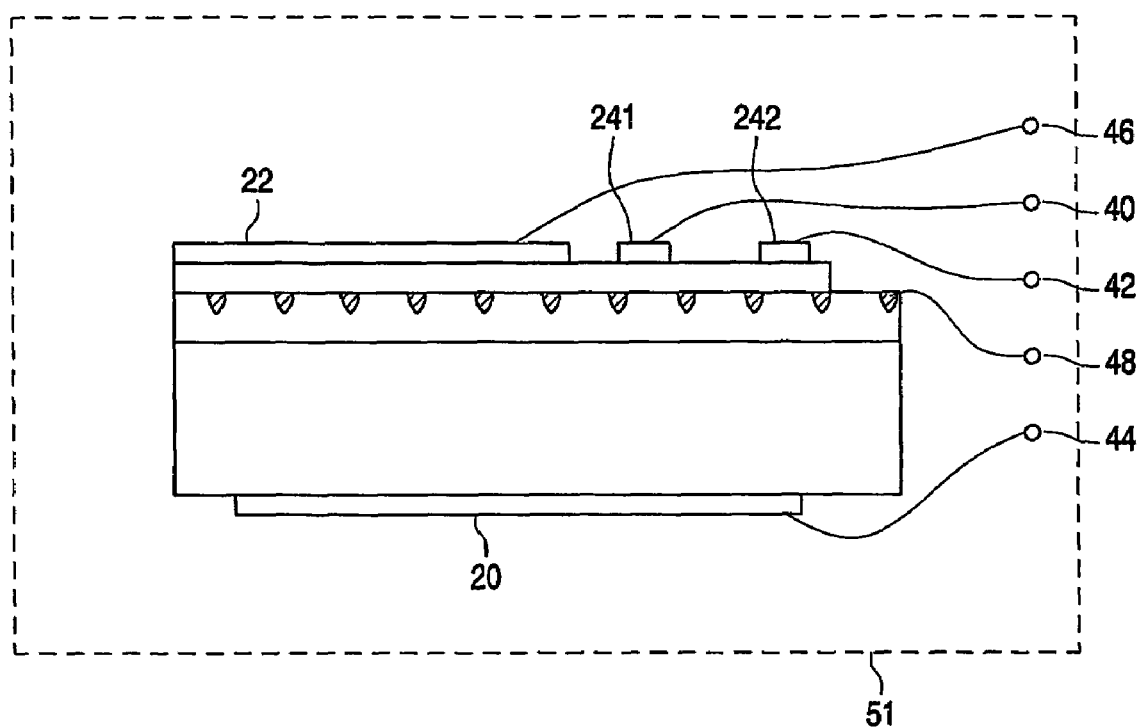
FIG. 4 shows schematically the terminals of a SenseMOS according to the invention.

The power semiconductor device in the first embodiment is packaged as indicated schematically by package 51 shown schematically in FIG. 4. In the arrangement shown, the power semiconductor device has first and second sense cell groups 30,32 each connected in parallel to corresponding first and second sense terminals 40,42. The common drain contact 20 is connected to a first main terminal 44 and a second main terminal 46 is connected to the main cells 16. Control terminal 48 is connected in common to the gates.

Figure 5:
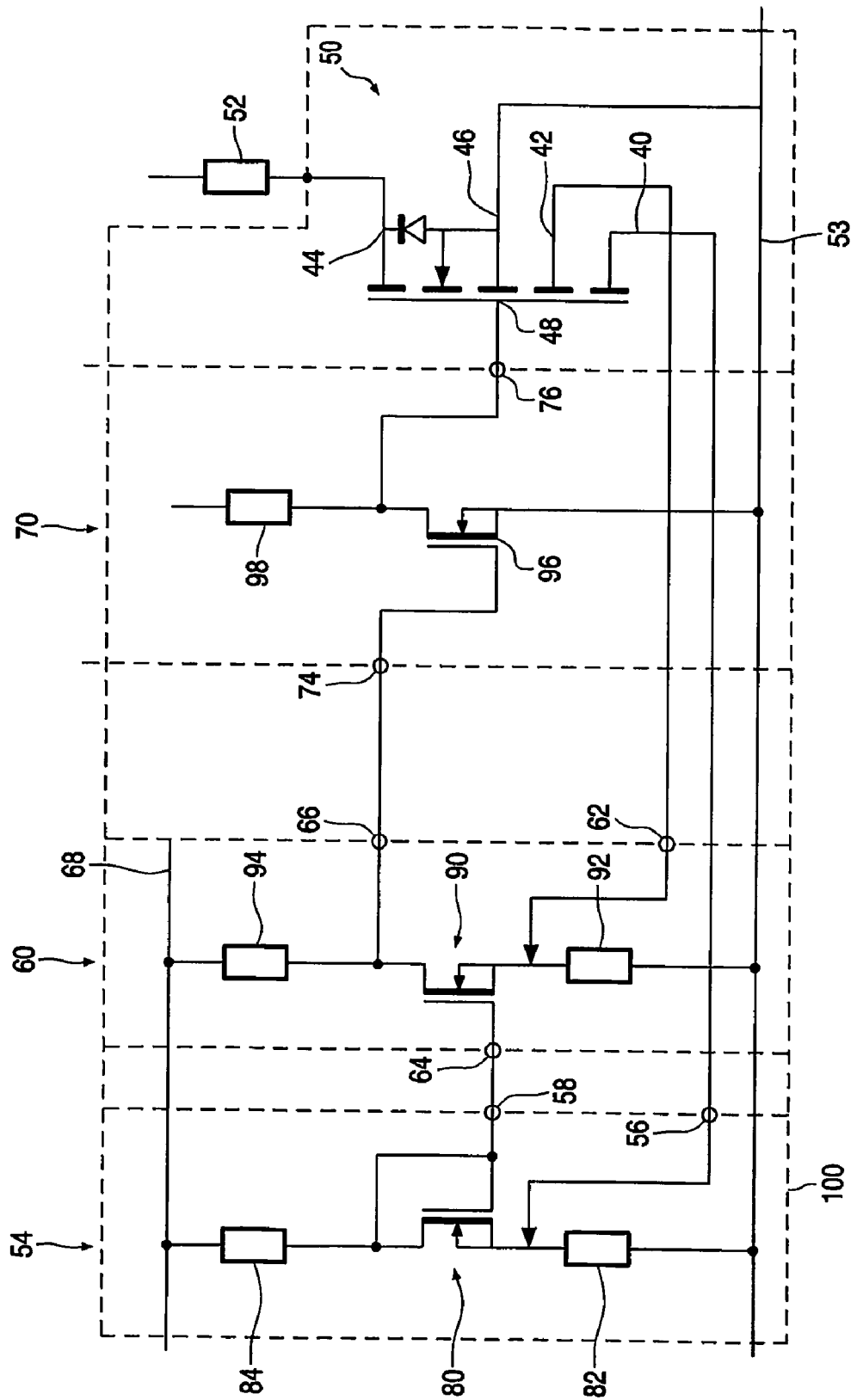
FIG. 5 shows a circuit according to the invention.

A circuit using this arrangement is shown by way of example in FIG. 5.

The first main terminal 44 is connected to load 52. The second main terminal 46 is connected to a source voltage rail 53.

The circuit includes reference sub-circuit 54 having input 56 connected to the first sense terminal 40 and having reference output 58. This sub-circuit 54 is connected in turn to sense sub-circuit 60 having input 62 connected to the second sense terminal 42 and control input 64 connected to the reference output 58. The sense sub-circuit has output 66. Note that the outputs and inputs may be nothing more than a track on a semiconductor substrate.

Both reference and sense sub-circuits are connected between logic supply rail 68 and the source voltage rail 53.

The reference sub-circuit 54 includes an n-type MOSFET 80 having its source connected directly to input 56 and through resistor 82 to the source voltage rail 53. The drain is connected through resistor 84 to the logic supply rail 68, and also to the gate which is in turn connected to output 58.

The sense sub-circuit 60 includes an n-type MOSFET 90 having its source connected directly to input 62 and through resistor 92 to the source voltage rail 53. The drain is connected through resistor 94 to the logic supply rail 68. The gate is connected to input 64 and hence to the output 58 of reference sub-circuit 54. The output 66 of the sense sub-circuit is taken from the drain.

The other part of the circuit is the drive circuit 70 having a further n-MOSFET 96 having its gate connected to the drive input 74 and hence in turn connected to the output 66 of the sense sub-circuit. The drain is connected to a gate drive (not shown) through resistor 98. The source is connected to source voltage rail 53. The output 76 of the drive circuit is taken from the drain and connected to the input 48 of the power transistor 50.

In operation, the circuit operates by comparing the voltage of the n-MOSFET 80 in the reference sub-circuit 54 with voltage at the gate of the n-MOSFET 90 in the sense sub-circuit 60. If the latter is too high, then the voltage to the gates of the MOSFET 96 of the drive circuit 70 and hence on the power MOSFET 50 is reduced until equilibrium is established. The circuit thus operates as a current limiting circuit.

The circuit compensates for the edge effect by injecting at the source of MOSFET 80 in the reference sub-circuit 54 the current from the sense terminal 40. This raises the gate voltage on output 58 of the reference sub-circuit 54 by an amount related to the current in edge cells. The sense current from sense terminal 42 is injected at the source of MOSFET 90 in the sense sub-circuit, which raises its voltage by the contributions from the normal cells and the edge cells. The voltage contributions from edge cells will cancel out, since both the first and second groups have the same number of edge cells and resistors 82, 92 are matched. The resultant correction signal applied to the drive circuit will only have contributions from the inner cells.

The ratio of load current to sense current should not vary very much with temperature since the properties of the edge cells will vary in parallel to the properties of other cells. The resistors 82, 92 are made of polysilicon which has a very low temperature coefficient.

Alternatively, the SenseMOS 50 may be used as a discrete device controlled by an operational amplifier with a virtual earth, as will be appreciated by the skilled person.

Because the edge effects are compensated for, it becomes possible to use smaller cell pitches in SenseMOS structures necessitating the use of dummy cells. These lower cell pitches in turn deliver the benefit of a lower specific drain source resistance in the on-state ($R_{ds}$ (on)) whilst still achieving an accurate load to sense current ratio.

In a second embodiment, the whole circuit of FIG. 5 except the load is incorporated in a single device package as indicated schematically by package 100 in FIG. 5.

Figure 6:
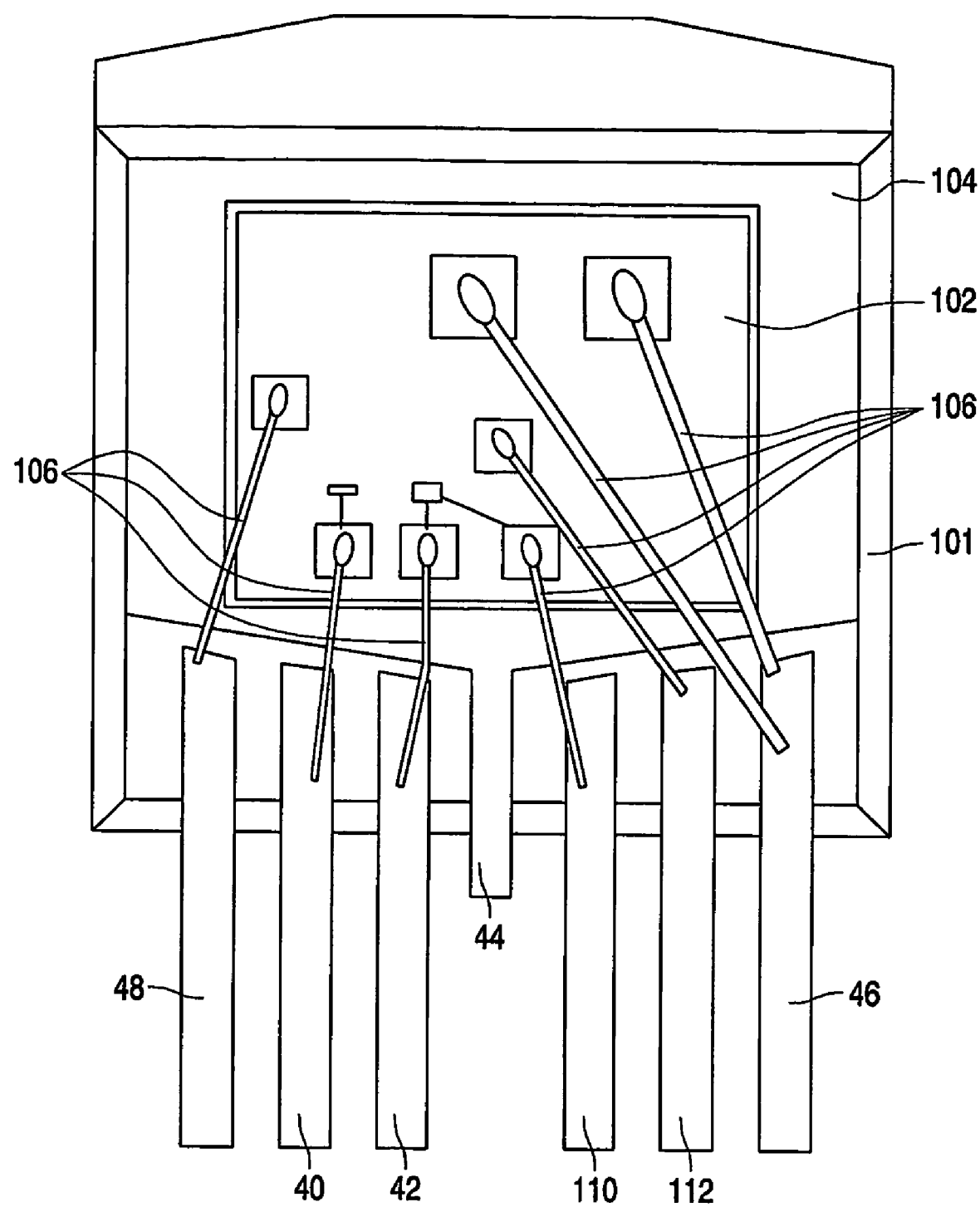
FIG. 6 shows a packaged semiconductor device according to the invention.

The invention may be used in discrete devices, illustrated schematically in FIG. 6. The semiconductor die 102 is mounted on a lead frame 104 and housed in a package 101.

The example shown is a seven pin package, in which terminals 40, 42, 44, 46, 48, 110 and 112 are electrically connected to the die by wires 106. In the illustrated device, main cell and sense cell Kelvin terminals 110 and 112 are provided connected on the chip to the sources 10 of the main cells 14 and sense cells 16 respectively. This allows the voltage at the sources 10 to be measured more accurately. The substantial current output on main terminal 46 causes voltage to be dropped and hence the voltage measured on terminal 46 is not an accurate measure of the voltage at the source. The use of Kelvin terminals 110, 112 to measure voltage without drawing substantial current alleviates this problem.

Applications for the invention include those which require load and sense current to be maintained very accurately over a wide range of load current, temperature and supply voltage.

From reading the present disclosure, other variations and modifications will be apparent to persons skilled in the art. Such variations and modifications may involve equivalent and other features which are already known in the design, manufacture and use of semiconductor devices and which may be used in addition to or instead of features described herein. Although claims have been formulated in this application to particular combinations of features, it should be understood that the scope of disclosure also includes any novel feature or any novel combination of features disclosed herein either explicitly or implicitly or any generalisation thereof, whether or not it mitigates any or all of the same technical problems as does the present invention. The applicants hereby give notice that new claims may be formulated to any such features and/or combinations of such features during the prosecution of the present application or of any further applications derived therefrom.

In particular, the invention can be used with trench cells of various shapes and arrangements. Nor is the invention limited to trench MOSFETs—the skilled person will readily realise how to realise the invention in alternative cell-based structures, including for example lateral MOSFETs, other types of vertical MOSFETs and even other structures.

Further, although the described embodiment uses two groups of sense cells and it is not generally desirable to have too many groups of sense cells, the invention may include further groups of sense cells if required.

The invention claimed is:

1. A power semiconductor device, comprising:
   first and second main terminals, at least one of which is for coupling a load;
   a control terminal; and
   a semiconductor body having opposed first and second major surfaces and a plurality of cells arranged as a lattice across the first major surface of the semiconductor body, the cells being divided into main cells and sense cells, each of the cells having a gate or base connected to the control terminal
   wherein each of the main cells is connected in parallel between the first and second main terminals to couple the first and second main terminals under the control of the control terminal;
   the power semiconductor device further comprises first and second sense terminals;
   the sense cells are divided into a plurality of groups of sense cells each arranged across the lattice in a pattern, each group of sense cells being connected in parallel between a respective sense terminal and the second main terminal; and
   a first group of sense cells is arranged across the lattice in a pattern having a different ratio of edge to inner cells to a second group of sense cells, inner sense cells being cells surrounded by other sense cells of the group and edge sense cells being arranged on the edge of the group of sense cells.

2. A semiconductor device according to claim 1 wherein the number of edge sense cells in the first and second groups of sense cells is substantially identical.

3. A semiconductor device according to any preceding claim wherein the cells are MOS cells including a gate-connected to the control terminal, and a source and drain, the source and drain of main cells being connected to the first and second main terminals and the source and drain of sense cells of a group being connected between the second main terminal and the respective sense terminal.

4. A semiconductor device according to claim 3 wherein the cells are trench MOSFET cells.

5. A semiconductor device according to claim 1 further comprising a Kelvin terminal connected to the source of the main cells.

6. A semiconductor arrangement comprising:
a semiconductor device according to claim 1;
a drive circuit having an input and an output, the output being connected to the control terminal for driving the control terminal; and
a compensation circuit having first and second sense inputs connected directly or indirectly to the first and second sense terminals, respectively, and an output connected to the drive circuit for controlling the drive circuit, wherein the compensation circuit outputs to the drive circuit input a signal based on the current in inner sense cells, obtained from the currents on the first and second sense inputs.

7. A semiconductor arrangement according to claim 6 wherein:
the compensation circuit includes a reference sub-circuit with an input connected to the first sense terminal connected to the first group of sense cells, and an output supplying a reference voltage, wherein the current from the first sense terminal is applied across a resistance to increase the reference voltage linearly with the current from the first group of sense cells;
the compensation circuit further includes a sense sub-circuit which has an input connected to the second sense terminal connected to the second group of sense cells wherein the current from the second group of sense cells is applied across a like resistance to that in the reference sub-circuit to generate a voltage; and
the sense sub-circuit has a compensation input connected to the output of the reference sub-circuit,
the sense sub-circuit being operable to compare the voltage input on the compensation input with that generated across the like resistor to generate an output supplying a compensated sense current signal to the drive circuit input for controlling the drive circuit to limit the current output by the power semiconductor device.

8. A semiconductor arrangement according to claim 7 wherein:
the power semiconductor device has MOS cells of predetermined first conductivity type having gate, source and drain, the gates of the cells being connected in parallel to the control terminal, the drains of the main and sense cells being connected in common to the first main terminal and the sources of the main and sense cells being connected to the second main terminal and sense terminals respectively;
wherein the second main terminal is connected to a source voltage rail ($V_{SS}$);
the drive circuit includes a FET of the first conductivity type having its source connected to the source voltage rail, its drain connected to the control terminal of the power semiconductor device and to a gate drive circuit;
the reference sub-circuit includes a FET of the first conductivity type having its source connected to the source voltage rail through the resistance, its drain connected through a resistance to a logic supply, its gate connected to its drain and to the output of the reference sub-circuit, and wherein the input of the reference sub-circuit is connected to the source of the reference sub-circuit FET for supplying the current output on the first sense terminal to the reference sub-circuit; and
the sense sub-circuit includes a FET of the first conductivity type having its source connected to the source voltage rail through the resistance, its drain connected through a resistance to a logic supply, its gate connected to the output of the reference sub-circuit, and wherein the input of the sense sub-circuit is connected to the second sense terminal for comparing the current output on the second sense terminal with a value set by the reference sub-circuit and outputting a signal to the drive circuit.

9. A semiconductor arrangement according to any of claims 6 to 8 housed in a single package.

10. A semiconductor arrangement according to any of claims 6 to 8 wherein the first main terminal is connected to a load.

11. A semiconductor device according to claim 1 wherein the first group of sense cells includes at least as many edge cells as inner cells, and wherein the second group of sense cells includes more inner cells than edge cells.

12. A semiconductor device according to claim 11 wherein at least 80% of the sense cells of the first group of sense cells are edge cells.

13. A semiconductor device according to claim 11 wherein the number of edge sense cells in the first and second groups of sense cells is substantially identical.

14. A semiconductor device according to claim 13 further including a compensation circuit that uses a current output from the first group of sense cells to compensate a current output from the second group of sense cells to thereby provide a signal reflective of the current in inner sense cells.

* * * * *